US011284536B2

(12) United States Patent
Ochiai

(10) Patent No.: US 11,284,536 B2
(45) Date of Patent: Mar. 22, 2022

(54) MODULE INCLUDING FIXATION PORTION PROVIDED AT POSITION AT WHICH STRESS FROM CONNECTION PIPE TO COOLING UNIT IS REDUCED AND SERVER INCLUDING THE SAME

(71) Applicant: NEC Platforms, Ltd., Kawasaki (JP)

(72) Inventor: Syoji Ochiai, Kanagawa (JP)

(73) Assignee: NEC Platforms, Ltd., Kanagawa (JP)

(*) Notice: Subject to any disclaimer, the term of this patent is extended or adjusted under 35 U.S.C. 154(b) by 0 days.

(21) Appl. No.: 16/756,746

(22) PCT Filed: Jul. 25, 2018

(86) PCT No.: PCT/JP2018/027925
§ 371 (c)(1),
(2) Date: Apr. 16, 2020

(87) PCT Pub. No.: WO2019/077831
PCT Pub. Date: Apr. 25, 2019

(65) Prior Publication Data
US 2021/0195795 A1    Jun. 24, 2021

(30) Foreign Application Priority Data
Oct. 20, 2017   (JP) ............................ JP2017-203293

(51) Int. Cl.
*H05K 7/20* (2006.01)
*F16L 35/00* (2006.01)

(52) U.S. Cl.
CPC .......... *H05K 7/20272* (2013.01); *F16L 35/00* (2013.01); *H05K 7/20763* (2013.01); *H05K 7/20254* (2013.01)

(58) Field of Classification Search
CPC ....... H05K 7/20763–7/20781; H05K 7/20218; H05K 7/20254; H05K 7/20272; G06F 1/20; H01L 23/473; F16L 13/06; F16L 35/00
(Continued)

(56) References Cited

U.S. PATENT DOCUMENTS 4,768,352 A * 9/1988 Maruyama .......... H01L 23/4006
165/80.4
5,630,255 A * 5/1997 Eliasson ................. F16L 33/08
24/274 R
(Continued)

FOREIGN PATENT DOCUMENTS

JP           4-67399 U     6/1992
JP           4-316783 A    11/1992
(Continued)

OTHER PUBLICATIONS

International Search Report for PCT/JP2018/027925 dated, Oct. 2, 2018 (PCT/ISA/210).
(Continued)

*Primary Examiner* — Zachary Pape
(74) *Attorney, Agent, or Firm* — Sughrue Mion, PLLC

(57) ABSTRACT

A module including a cooling unit that cools a heat-generating component provided on a substrate; a connection pipe that is connected to the cooling unit; and a fixation portion that is provided at a position at which stress from the connection pipe to the cooling unit is reduced, and that fixes the connection pipe.

12 Claims, 5 Drawing Sheets

(58) Field of Classification Search
USPC .......... 361/699, 702; 165/80.4–80.5, 104.33; 285/114–116
See application file for complete search history.

(56) References Cited

U.S. PATENT DOCUMENTS

| | | | |
|---|---|---|---|
| 5,946,191 | A | 8/1999 | Oyamada |
| 7,029,315 | B2* | 4/2006 | Dang ................. H01R 13/5841 439/468 |
| 7,044,196 | B2* | 5/2006 | Shook .................... F04B 17/00 165/104.33 |
| 7,428,150 | B1* | 9/2008 | Stefanoski ............. G06F 1/185 165/80.4 |
| 7,950,244 | B2* | 5/2011 | Iyengar ............. H05K 7/20781 62/259.2 |
| 8,634,194 | B2* | 1/2014 | Yamaura ........... H05K 7/20927 361/699 |
| 9,167,721 | B2* | 10/2015 | Campbell ......... H05K 7/20781 |
| 9,298,227 | B2* | 3/2016 | Lee ........................ G06F 1/185 |
| 2003/0128517 | A1 | 7/2003 | Faneuf et al. |
| 2006/0187638 | A1* | 8/2006 | Vinson ............... H05K 7/20009 361/698 |
| 2007/0218711 | A1 | 9/2007 | Takahashi |
| 2011/0051372 | A1* | 3/2011 | Barringer ........... H05K 7/20781 361/701 |
| 2015/0070844 | A1 | 3/2015 | Chang et al. |
| 2020/0053904 | A1* | 2/2020 | Panella ................ H05K 7/1498 |

FOREIGN PATENT DOCUMENTS

| | | |
|---|---|---|
| JP | 5-048238 A | 2/1993 |
| JP | 2000-338173 A | 12/2000 |
| JP | 2001-111279 A | 4/2001 |
| JP | 2007-281430 A | 10/2007 |
| JP | 2010-163018 A | 7/2010 |
| JP | 2011-253984 A | 12/2011 |
| JP | 2013-225599 A | 10/2013 |
| JP | 2013-232505 A | 11/2013 |
| JP | 2017-511567 A | 4/2017 |

OTHER PUBLICATIONS

Japanese Office Action for 2017-203293 dated Jun. 5, 2018.
Japanese Notice of Allowance for 2017-203293 dated Sep. 26, 2019.
Extended European Search Report for EP Application No. EP18867769.4 dated Jun. 10, 2021.

* cited by examiner

MODULE INCLUDING FIXATION PORTION PROVIDED AT POSITION AT WHICH STRESS FROM CONNECTION PIPE TO COOLING UNIT IS REDUCED AND SERVER INCLUDING THE SAME

CROSS REFERENCE TO RELATED APPLICATIONS

This application is a National Stage of International Application No. PCT/JP2018/027925 filed Jul. 25, 2018, claiming priority based on Japanese Patent Application No. 2017-203293, filed Oct. 20, 2017.

TECHNICAL FIELD

The present invention relates to a module, and a server.

BACKGROUND ART

Patent Document 1 discloses a configuration provided with a cooling device for cooling electronic components on a printed circuit board. In this configuration, cooling pipes through which a refrigerant flows are connected to the cooling device. The cooling pipes are attached to a fixation block by a fixation angle attached to the edge of a printed circuit board.

CITATION LIST

Related Literature

[Patent Document 1]
Japanese Unexamined Patent Application, First Publication No 2000-338173

SUMMARY OF INVENTION

Problem to be Solved by the Invention

However, when a force is exerted on a connection pipe connected to a cooling module, the connection pipe can be displaced, and there are cases in which stress is applied to a connection portion for connecting the end of a cooling pipe to a substrate, thus having a detrimental impact. As a solution thereto, Patent Document 1 merely discloses the feature of fixing the cooling pipes themselves. With such a configuration, it is difficult to suppress stress that is applied to the connection portion for connecting the end of the cooling pipe to the substrate when the connection pipe is displaced.

The present invention provides a module and a server that can reduce stress that is generated when a force is exerted on a connection pipe.

Means for Solving the Problem

A module according to the present invention includes a cooling unit that cools a heat-generating component provided on a substrate; a connection pipe that is connected to the cooling unit; and a fixation portion that is provided at a position at which stress from the connection pipe to the cooling unit is reduced, and that fixes the connection pipe.

A server according to the present invention includes the module as mentioned above; and a housing that contains the module.

Advantageous Effects of Invention

According to the module and the server in the present invention, it is possible to reduce stress that is generated when a force is exerted on a connection pipe.

DESCRIPTION OF EMBODIMENTS

Multiple embodiments of the present invention will be explained below with reference to the drawings. However, regarding the present embodiments, the portions that are identical to the aforementioned conventional examples will be referred to by using the same names, and their explanations will be omitted.

First Embodiment

Figure 1:
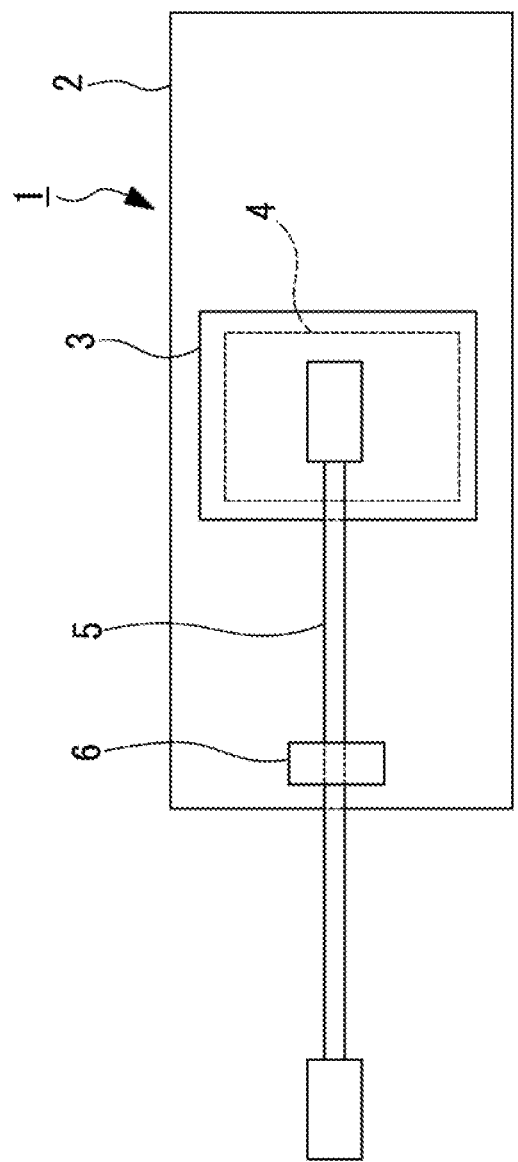
FIG. 1 is a diagram illustrating the minimum structure of a module according to a first embodiment.

FIG. 1 is a diagram illustrating the minimum structure of a module according to a first embodiment.
As illustrated in this drawing, it is sufficient for the module 1 to comprise at least a cooling unit 3, a connection pipe 5 and a fixation portion 6.
The cooling unit 3 cools a heat-generating component 4 provided on a substrate 2.
The connection pipe 5 is connected to the cooling unit 3. The fixation portion fixes the connection pipe 5. The fixation portion 6 is provided at a position at which stress from the connection pipe 5 to the cooling unit 3 is reduced.
In this module 1, the connection pipe 5 is fixed by the fixation portion 6, so that even if the connection pipe 5 moves on the side opposite to the cooling unit 3 relative to the fixation portion 6, the movement of the connection pipe 5 is not easily transmitted past the fixation portion 6 towards the cooling unit 3. As a result thereof, stress applied from the connection pipe 5 to the cooling unit 3 can be reduced. Therefore, stress that is generated when a force is exerted on the connection pipe 5 can be reduced.

Second Embodiment

Figure 2:
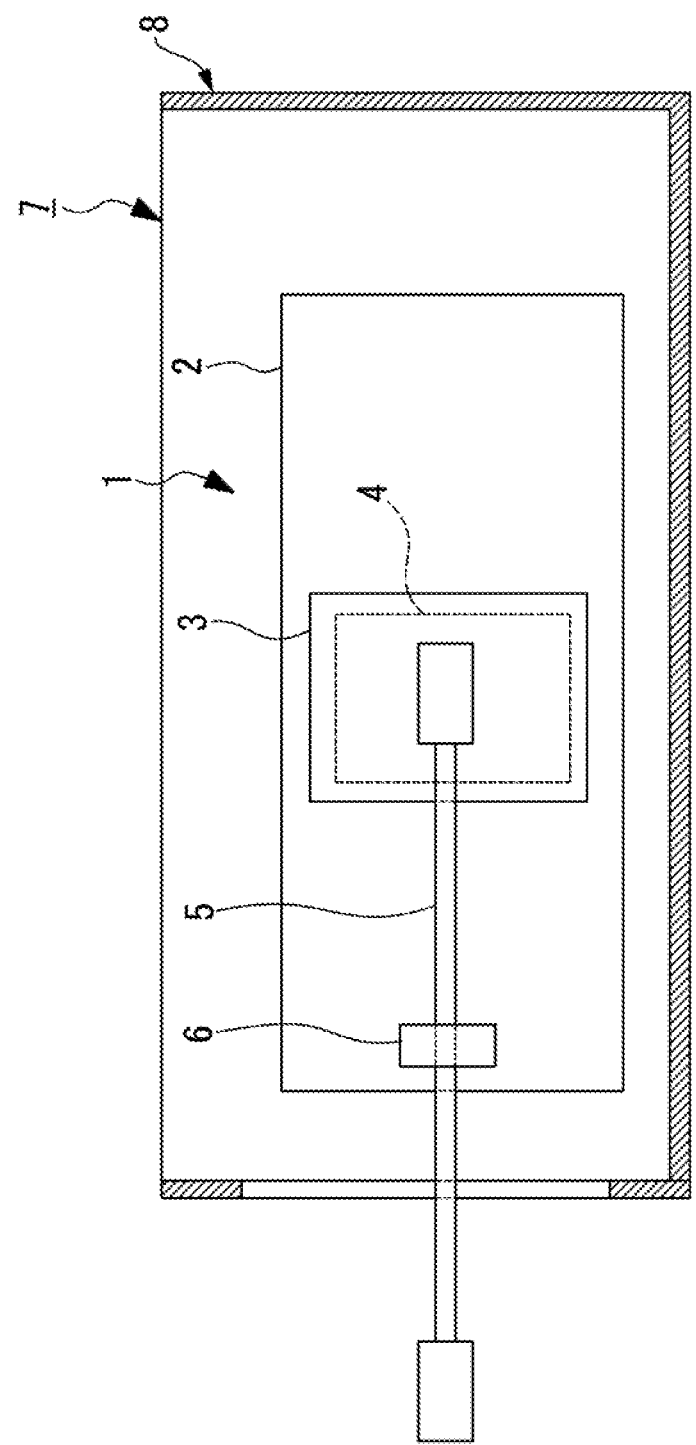
FIG. 2 is a diagram illustrating the minimum structure of a server according to a second embodiment.

FIG. 2 is a diagram illustrating the minimum structure of a server according to a second embodiment.
As illustrated in this drawing, it is sufficient for the server 7 to comprise at least a module 1 and a housing 8.
The module 1 is similar to that indicated in the above-mentioned first embodiment. In other words, the module 1 comprises at least a cooling unit 3, a connection pipe 5 and a fixation portion 6.
The cooling unit 3 cools a heat-generating component 4 provided on a substrate 2.
The connection pipe 5 is connected to the cooling unit 3. The fixation portion 6 fixes the connection pipe 5. The fixation portion 6 is provided at a position at which stress from the connection pipe 5 to the cooling unit 3 is reduced.

The housing 8 contains the module 1.

In this server 7, the connection pipe 5 is fixed by the fixation portion 6, so that even if the connection pipe 5 moves on the side opposite to the cooling unit 3 relative to the fixation portion 6, the movement of the connection pipe 5 is not easily transmitted past the fixation portion 6 towards the cooling unit 3. As a result thereof, stress applied from the connection pipe 5 to the cooling unit can be reduced. Therefore, stress that is generated when a force is exerted on the connection pipe 5 can be reduced.

Third Embodiment

Figure 3:
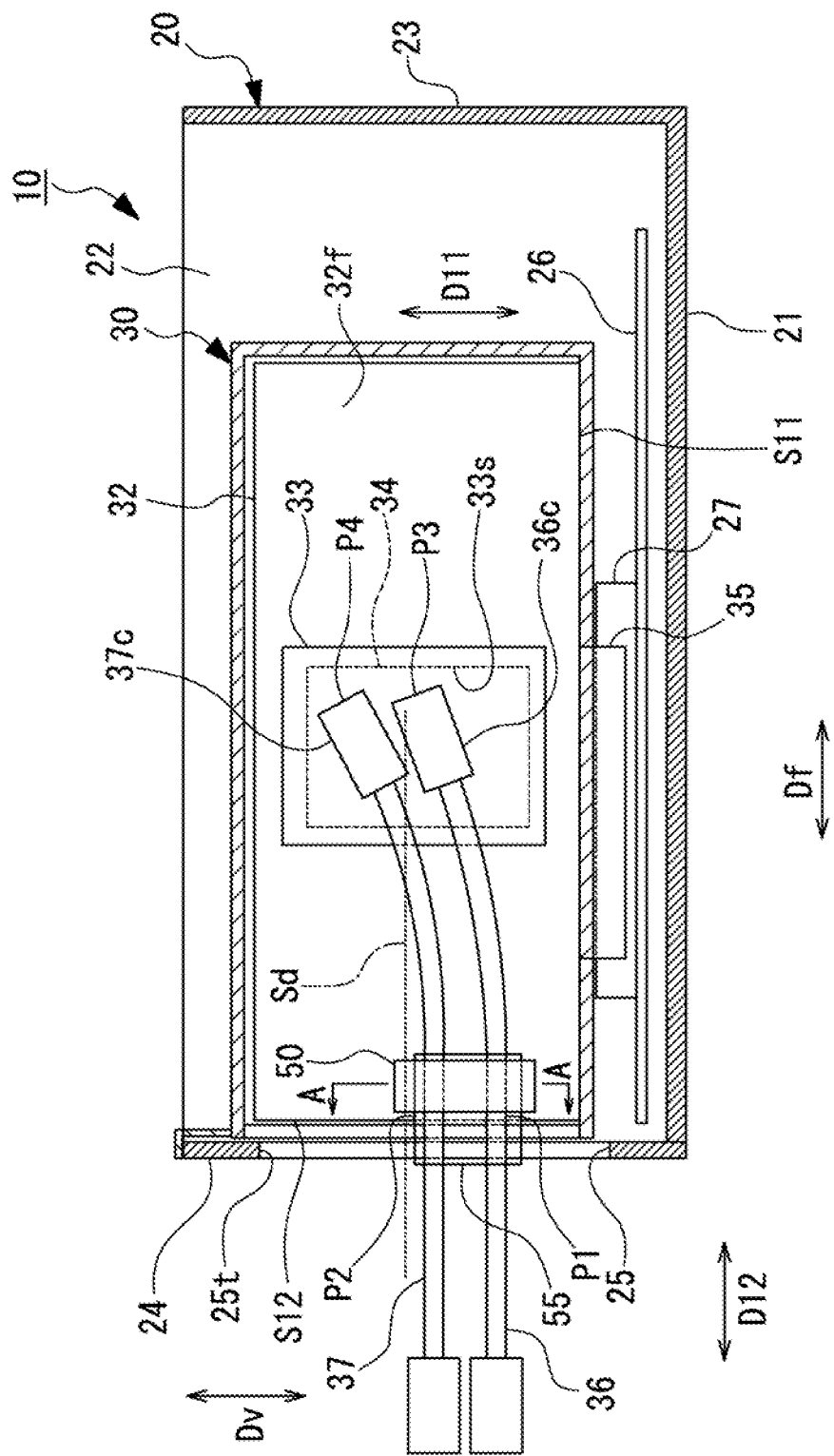
FIG. 3 is a vertical section view illustrating the structure of a server according to a third embodiment.
Figure 4:
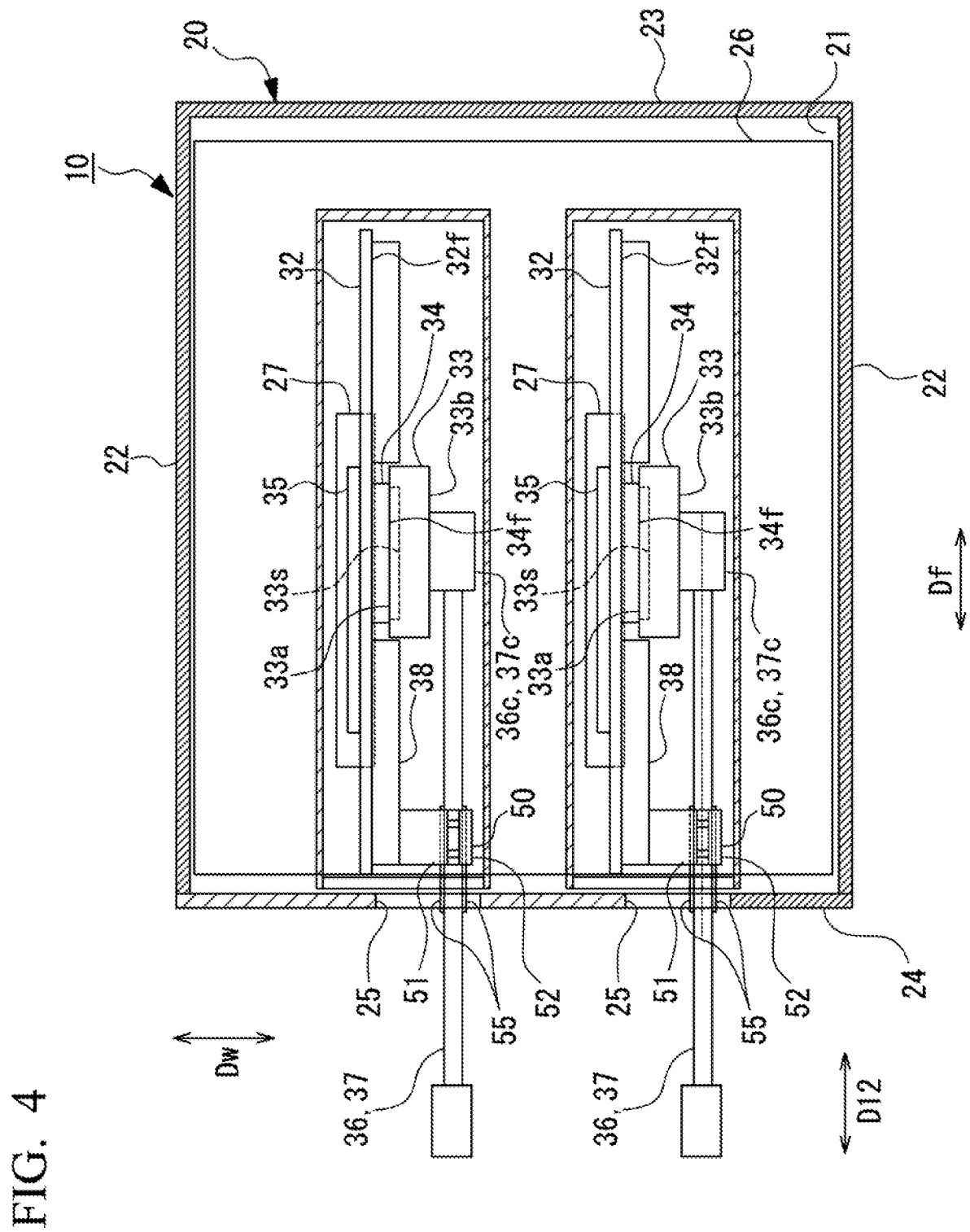
FIG. 4 is a horizontal section view illustrating the structure of a server according to the third embodiment.

FIG. 3 is a vertical section view illustrating the structure of a server according to the third embodiment. FIG. 4 is a horizontal section view illustrating the structure of the server according to the third embodiment.

As illustrated in FIG. 3 and FIG. 4, the server 10 of the third embodiment comprises a housing 20 and a module 30.

The housing 20 is in the shape of a hollow box and is contained in a server rack, which is not illustrated. The housing 20 is supported so as to be able to slide in a horizontal direction (hereinafter referred to as the front-rear direction Df) connecting one end of the server rack (not illustrated) with the other end. The housing 20 contains, in the interior thereof, a base substrate 26, a module 30, a power supply device (not illustrated) and the like.

The housing 20 comprises a bottom plate 21, side plates 22, a front plate 23 and a rear plate (plate) 24.

The bottom plate 21, in plan view, is rectangular, having long edges in the front-rear direction Df and having short edges in the width direction Dw orthogonal to the front-rear direction Df. The side plates 22 are located on both sides, in the width direction Dw, of the bottom plate 21. The side plates 22 respectively extend upward, in the vertical direction Dv, from both sides, in the width direction Dw, of the bottom plate 21. The front plate 23 is located on one end, in the front-rear direction Df, of the bottom plate 21. The front plate 23 extends upward from the front end of the bottom plate 21. The rear plate 24 is located on the other end, in the front-rear direction Df, of the bottom plate 21. The rear plate 24 extends upward from the rear end of the bottom plate 21.

The rear plate 24 has opening portions 25 penetrating therethrough in the front-rear direction Df. A plurality of the opening portions 25 are provided so as to be spaced apart in the width direction Dw.

The base substrate 26 is plate-shaped and is provided along the bottom plate 21 of the housing 20. The base substrate 26 has a connector 27 on the upper surface thereof. A connection terminal portion 35 of the module 30 to be mentioned below is connected to the connector 27.

The module 30 comprises a substrate 32, a cooling unit 33, a supply connection pipe (connection pipe) 36, a discharge connection pipe (connection pipe) 37 and a fixation portion 50.

The substrate 32 is in the shape of a rectangular plate having short edges (pipe-extending edge) S12 and long edges S11. The substrate 32 is arranged so that the long edges S11 are aligned with the front-rear direction Df and the short edges S12 are aligned with the vertical direction Dv, in the state in which the module 30 is contained inside the housing 20.

The substrate 32 has a connection terminal portion 35. The connection terminal portion 35 is provided on one of the long edges S11 on the substrate 32. The connection terminal portion 35 is provided on the long edge S11 located on the lower side, in the vertical direction Dv, in the state in which the module 30 is contained inside the housing 20. The connection terminal portion 35 is inserted and withdrawn with respect to the connector 27 on the base substrate 26 inside the housing 20. The insertion/withdrawal direction D11 of the connection terminal portion 35 with respect to the connector 27 is a direction orthogonal to the upper surface of the base substrate 26, i.e., the vertical direction Dv.

The substrate 32 has a heat-generating component 34 such as a CPU (Central Processing Unit). The heat-generating component 34 is mounted on one surface 32f of the substrate 32.

The cooling unit 33 is provided on the substrate 32. The cooling unit 33 is provided so as to be stacked on the heat-generating component 34. More specifically, the cooling unit 33 should preferably have a structure such that, when stacked on the substrate 32, there is contact with the substrate 32 over as large an area as possible and there is tight contact with the substrate 32 with as large a contact force as possible, so that heat is transferred with the lowest possible contact resistance. The cooling unit 33 cools the heat-generating component 34. The cooling unit 33 has a rectangular shape that is larger than the heat-generating component 34 when viewed from a direction orthogonal to the one surface 32f of the substrate 32. The cooling unit 33 has a prescribed thickness in the direction orthogonal to the one surface 32f of the substrate 32. The cooling unit 33 has a recess 33s in a first surface 33a facing the heat-generating component 34. The recess 33s is recessed from the first surface 33a towards a second surface 33b on the side opposite thereto. The recess 33s covers at least a portion of the surface 34f of the heat-generating component 34.

The supply connection pipe 36 and the discharge connection pipe 37 are connected to the cooling unit 33. The supply connection pipe 36 and the discharge connection pipe 37 have flexibility.

The supply connection pipe 36 supplies a coolant to the cooling unit 33. The supply connection pipe 36 has a connection portion 36c on one end. The connection portion 36c on the supply connection pipe 36 is connected to the cooling unit 33. The connection portion 36c is arranged to be on one side, relative to the center of the heat-generating component 34, in the recess 33s in the cooling unit 33. The connection portion 36c is arranged to be, for example, on the lower side, in the vertical direction Dv, relative to the center of the heat-generating component 34, in the state in which the module 30 is contained inside the housing 20.

The supply connection pipe 36 extends to the outside of the substrate 32. The supply connection pipe 36 extends from the substrate 32 in the direction D12, which is different from the insertion/withdrawal direction D11 of the connection terminal portion 35. The supply connection pipe 36 extends to the outside of the substrate 32 from a short edge S12 of the substrate 32, which is different from the long edge S11 on which the connection terminal portion 35 is provided. The supply connection pipe 36 is connected to a supply pipe (not illustrated). The supply pipe (not illustrated) supplies the supply connection pipe 36 with a coolant supplied from coolant supply equipment (not illustrated).

The discharge connection pipe 37 discharges the coolant from the cooling unit 33. The discharge connection pipe 37 is provided alongside the supply connection pipe 36 in a direction along the one surface 32f of the substrate 32.

The discharge connection pipe 37 has a connection portion 37c on one end. The connection portion 37c on the discharge connection pipe 37 is connected to the cooling unit 33. The connection portion 37c is arranged to be on the other side, relative to the center of the heat-generating component

34, in the recess 33s in the cooling unit 33. The connection portion 37c is arranged to be, for example, on the upper side, in the vertical direction Dv, relative to the center of the heat-generating component 34, in the state in which the module 30 is contained inside the housing 20.

The discharge connection pipe 37 extends to the outside of the substrate 32. The discharge connection pipe 37 extends from the substrate 32 in the direction D12, which is different from the insertion/withdrawal direction D11 of the connection terminal 35. The discharge connection pipe 37 extends to the outside of the substrate 32 from a short edge S12 of the substrate 32, which is different from the long edge S11 on which the connection terminal portion 35 is provided. The discharge connection pipe 37 is connected to a discharge pipe (not illustrated) that discharges the coolant to the outside.

The supply connection pipe 36 and the discharge connection pipe 37 respectively extend from extension positions P1 and P2 that are located, on the short edge S12 of the substrate 32 from which the supply connection pipe 36 and the discharge connection pipe 37 extend, on the side towards the connection terminal portion 35 relative to the center Sd of the short edge S12. For example, the supply connection pipe 36 and the discharge connection pipe 37 extend from extension positions P1 and P2, on the short edge S12, which are closer to the long edge S11 on which the connection terminal portion 35 is provided than the center Sd is.

The supply connection pipe 36 and the discharge connection pipe 37 are respectively connected to the cooling unit 33 at connection positions P3 and P4 that are shifted towards the side opposite (the upper side in FIG. 3) to the side (the side towards the base substrate 26, the lower side in FIG. 3) on which the connection terminal portion 35 is provided, relative to the extension positions P1 and P2 from which the supply connection pipe 36 and the discharge connection pipe 37 extend from the pipe-extending short edge S12.

From the connection positions P3 and P4 to the extension positions P1 and P2, the supply connection pipe 36 and the discharge connection pipe 37 are respectively curved towards the side on which the connection terminal portion 35 is provided. Furthermore, the supply connection pipe 36 and the discharge connection pipe 37 extend from the cooling unit 33 in mutually different directions. For example, the supply connection pipe 36 and the discharge connection pipe 37 extend with different orientations. Specifically, the connection portion 36c of the supply connection pipe 36 and the connection portion 37c of the discharge connection pipe 37 are not parallel to each other when viewed from a direction orthogonal to the one surface 32f of the substrate 32. The connection portion 36c of the supply connection pipe 36 and the connection portion 37c of the discharge connection pipe 37 are respectively inclined relative to the direction parallel to the long edges S11 of the substrate 32. The inclination angle of the connection portion 37c of the discharge connection pipe 37 relative to the direction parallel to the long edges S11 is greater than the inclination angle of the connection portion 36c of the supply connection pipe 36.

The fixation portion 50 fixes the supply connection pipe 36 and the discharge connection pipe 37. The fixation portion 50 is provided at a position at which stress from the supply connection pipe 36 and the discharge connection pipe 37 to the cooling unit 33 is reduced. Specifically, the fixation portion 50 fixes the supply connection pipe 36 and the discharge connection pipe 37 at positions distanced from the connection portions 36c and 37c connected to the cooling unit 33. The fixation portion 50 constrains the movement of the supply connection pipe 36 and the discharge connection pipe 37 in the pipe axial directions. Additionally, the fixation portion 50 constrains the movement of the supply connection pipe 36 and the discharge connection pipe 37 in the radial directions perpendicular to the pipe axial directions. The fixation portion 50 fixes the supply connection pipe 36 and the discharge connection pipe 37, respectively, on the short edge S12 of the substrate 32 from which the supply connection pipe 36 and the discharge connection pipe 37 extend. The fixation portion 50 is arranged to be towards the substrate 32 relative to the rear plate 24. The fixation portion 50 is arranged to be on the inside of the rear plate 24 of the housing 20.

Figure 5:
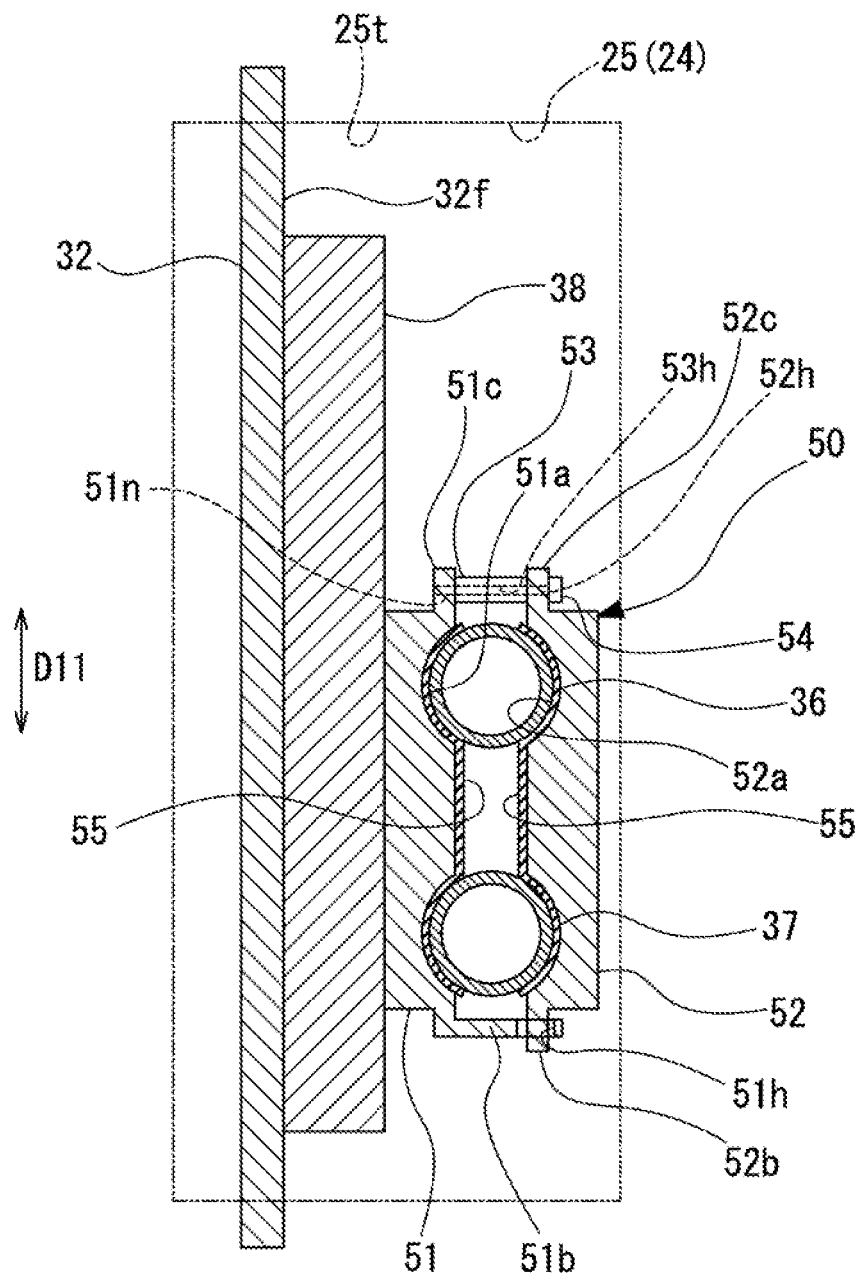
FIG. 5 is a section view illustrating the structure of a fixation portion according to the third embodiment.

FIG. 5 is a section view illustrating the structure of the fixation portion in the present embodiment.

As illustrated in FIG. 4 and FIG. 5, the fixation portion 50 is attached to a reinforcement member 38. The reinforcement member 38 is arranged parallel to the substrate 32. The reinforcement member 38 is provided on the one surface 32f of the substrate 32 at a portion where the cooling unit 33 is not provided. The reinforcement member 38 comprises, for example, an aluminum alloy or the like. The reinforcement member 38 has the function of reinforcing the substrate 32 and the function of receiving heat transferred from various types of electronic components mounted on the one surface 32f of the substrate 32 and dissipating the heat.

As illustrated in FIG. 5, the fixation portion 50 has a base member 51, a clamp member 52 and a spacer 53.

The base member 51 is fixed to the reinforcement member 38. The base member 51 may be formed integrally with the reinforcement member 38. The base member 51 has a receiving recess 51a, an engagement portion 51b and a pedestal portion 51c. The receiving recess 51a accommodates portions, in the radial direction, of the supply connection pipe 36 and the discharge connection pipe 37. The engagement portion 51b is provided on one side of the receiving recess 51a and extends away from the reinforcement member 38 and towards the clamp member 52. The engagement portion 51b has an engagement hole 51h for engaging with the clamp member 52. The pedestal portion 51c is provided on the other side of the receiving recess 51a. The pedestal portion 51c is located on the side opposite to the engagement portion 51b with the receiving recess 51a therebetween. The pedestal portion 51c has a female screw hole 51n.

The clamp member 52 faces the base member 51 on the side away from the reinforcement member 38. The clamp member 52 has a receiving recess 52a, an engagement claw 52b and a flange portion 52c. The receiving recess 52a accommodates portions, in the radial direction, of the supply connection pipe 36 and the discharge connection pipe 37.

The engagement claw 52b is provided on one side of the receiving recess 52a. The engagement claw 52b engages with the engagement hole 51h on the engagement portion 51b of the base member 51. The flange portion 52c is provided on the other side of the receiving recess 52a. The flange portion 52c is located on the side opposite to the engagement claw 52b with the receiving recess 52a therebetween. The flange portion 52c has a screw penetration hole 52h.

The spacer 53 is arranged between the pedestal portion 51c of the base member 51 and the flange portion 52c of the clamp member 52. The spacer 53 is tubular and has a through hole 53h.

With this fixation portion 50, the supply connection pipe 36 and the discharge connection pipe 37 are sandwiched between the receiving recess 51a in the base member 51 and the receiving recess 52a in the clamp member 52. The clamp member 52 is restricted from moving in the direction away from the reinforcement member 38 on one side of the receiving recess 52a by the engagement claw 52b being engaged with the engagement hole 51h. Additionally, the clamp member 52 is fastened to the base member 51 by a screw 54 on the other side of the receiving recess 52a. The screw 54 is passed through the screw penetration hole 52h in the flange portion 52c of the clamp member 52 and the through hole 53h in the spacer 53, and is screwed into the female screw hole 51n in the pedestal portion 51c of the base member 51. The spacing between the flange portion 52c of the clamp member 52 and the pedestal portion 51c of the base member 51 is regulated by the spacer 53. As a result thereof, the supply connection pipe 36 and the discharge connection pipe 37 sandwiched between the receiving recess 51a of the base member 51 and the receiving recess 52a of the clamp member 52 can be kept from being excessively crushed in the radial direction.

As illustrated in FIG. 4, the supply connection pipe 36 and the discharge connection pipe 37 fixed by the fixation portion 50 are spaced (the spacing from the substrate 32 in a direction orthogonal to the one surface 32f of the substrate 32) from the substrate 32 by the same distance at the parts connected to the cooling unit 33 and at the parts fixed to the fixation portion 50.

Additionally, as illustrated in FIG. 3, the supply connection pipe 36 and the discharge connection pipe 37 are curved between the parts fixed to the fixation portion 50, and the connection portions 36c and 37c, which are the parts connected to the cooling unit 33.

As illustrated in FIG. 5, elastic sheets 55 are sandwiched between the base member 51 and the clamp member 52 of the fixation portion 50, and the supply connection pipe 36 and the discharge connection pipe 37. The elastic sheets 55 comprise a rubber-based material or the like, and have elasticity. Due to the elastic sheets 55, a compressive force in the radial direction is applied to the supply connection pipe 36 and the discharge connection pipe 37 sandwiched by the receiving recess 51a in the base member 51 and the receiving recess 52a in the clamp member 52. The elastic sheets 55 are elastically deformed in the thickness directions thereof, thereby reducing the compressive force in the radial direction applied to the supply connection pipe 36 and the discharge connection pipe 37.

Additionally, the elastic sheets 55, due to the friction with the supply connection pipe 36 and the discharge connection pipe 37, keep the supply connection pipe 36 and the discharge connection pipe 37 from shifting in the pipe axial direction. Furthermore, the elastic sheets 55 are provided, in a state of compression in the thickness directions thereof, between the base member 51 and the clamp member 52 of the fixation portion 50, and the supply connection pipe 36 and the discharge connection pipe 37. As a result thereof, the friction generated between the base member 51 and the clamp member 52 of the fixation portion, and the supply connection pipe 36 and the discharge connection pipe 37, is increased. As a result thereof, the shifting of the supply connection pipe 36 and the discharge connection pipe 37 in the pipe axial direction can be more reliably suppressed.

As illustrated in FIG. 3 and FIG. 4, the rear plate 24 faces the short side S12 of the substrate 32 from which the supply connection pipe 36 and the discharge connection pipe 37 extend, in the state in which the module 30 is contained inside the housing 20. The connection pipe 36 and the discharge connection pipe 37 extend to the outside of the housing 20 through an opening portion 25 formed in the rear plate 24 of the housing 20.

The elastic sheets 55 extend from the fixation portion 50 to the inside of the opening portion 25. The elastic sheets 55 are located between the inner rim of the opening portion 25, and the supply connection pipe 36 and the discharge connection pipe 37. As a result thereof, the supply connection pipe 36 and the discharge connection pipe 37 are kept from scraping against the inner rim of the opening portion 25.

The module 30 as described above can be attached to or detached from the housing 20. When attaching or detaching the module 30 with respect to the housing 20, the connection terminal portion 35 is inserted or withdrawn with respect to the connector 27 in the base substrate 26 in the housing 20. When inserting or withdrawing the connection terminal portion 35 with respect to the connector 27, the substrate 32 is inserted or withdrawn in the insertion/withdrawal direction D11, which intersects the long edge S11 of the substrate 32 on which the connection terminal portion 35 is provided.

When withdrawing the connection terminal portion 35 from the connector 27, the substrate 32 is displaced in the direction away from the connection terminal portion 35 in the insertion/withdrawal direction D11 intersecting the long edge S11 on which the connection terminal portion 35 is provided. When displacing the substrate 32 in the insertion/withdrawal direction D11 in this way, the supply connection pipe 36 and the discharge connection pipe 37 extend from a side of the short edge S12 towards the connection terminal portion 35 relative to the center Sd. For this reason, there is no tendency to interfere with other components such as, for example, the inner rim 25t of the opening portion 25, located on the side opposite to the connection terminal portion 35. Therefore, the substrate 32 can be easily inserted and withdrawn in the module 30 comprising the supply connection pipe 36 and the discharge connection pipe 37 extending in the direction D12, which is different from the insertion/withdrawal direction D11 of the connection terminal portion 35.

In this module 30 and server 10, the supply connection pipe 36 and the discharge connection pipe 37 are fixed by the fixation portion 50. As a result thereof, even if the supply connection pipe 36 and the discharge connection pipe 37 are moved outside the module 30, the movement of the supply connection pipe 36 and the discharge connection pipe 37 is not easily transmitted past the fixation portion 50 towards the cooling unit 33. Therefore, stress applied from the supply connection pipe 36 and the discharge connection pipe 37 to the cooling unit 33 can be reduced. As a result thereof, it is possible to keep too much force from being applied to the cooling unit 33, or to the connection portions for connecting the supply connection pipe 36 and the discharge connection pipe 37 to the cooling unit 33, thereby preventing leakage of the coolant and the like.

In this server 10, the fixation portion 50 constrains the movement of the supply connection pipe 36 and the discharge connection pipe 37 in the pipe axial direction. Thus, by completely constraining the movement of the supply connection pipe 36 and the discharge connection pipe 37, the stress that is generated when a force is exerted on the supply connection pipe 36 and the discharge connection pipe 37 can be cut off. Therefore, the stress applied from the supply connection pipe 36 and the discharge connection pipe 37 to the cooling unit 33 can be reliably reduced.

In this server 10, the supply connection pipe 36 and the discharge connection pipe 37 are fixed at positions distanced from the ends (connection portions 36c, 37c) connected to the cooling unit 33. As a result thereof, even when there is displacement that is not able to be fully absorbed by the fixation portion 50 between the fixation portion 50 and the ends of the supply connection pipe 36 and the discharge connection pipe, the supply connection pipe 36 and the discharge connection pipe 37 themselves can elastically deform, thereby allowing the displacement to be absorbed. As a result thereof, it is possible to keep stress from reaching the cooling unit 33 from the ends of the supply connection pipe 36 and the discharge connection pipe 37.

In this server 10, the supply connection pipe 36 and the discharge connection pipe 37 are respectively curved between the parts connected to the cooling unit 33 and the parts fixed to the fixation portion 50. As a result thereof, even when there is displacement that is not able to be fully absorbed by the fixation portion 50 between the fixation portion 50 and the ends of the supply connection pipe 36 and the discharge connection pipe 37, the supply connection pipe 36 and the discharge connection pipe 37 themselves can respectively elastically deform, thereby absorbing the displacement. As a result thereof, it is possible to keep stress from reaching the cooling unit 33 from the ends of the supply connection pipe 36 and the discharge connection pipe 37.

In this server 10, the supply connection pipe 36 and the discharge connection pipe 37 are spaced from the substrate 32 by the same distance at the parts connected to the cooling unit 33 and at the parts fixed to the fixation portion 50.

In this way, the heights of the clamp positions at which the fixation portion 50 clamps the supply connection pipe 36 and the discharge connection pipe 37 are the same as the heights of the connection portions at which the supply connection pipe 36 and the discharge connection pipe 37 are connected to the cooling unit 33.

Thus, bending stress in the height direction can be kept from being generated in the supply connection pipe 36 and the discharge connection pipe 37. Therefore, it is possible to keep excessive bending stress from being applied at the connection portions at which the supply connection pipe 36 and the discharge connection pipe 37 are connected to the cooling unit 33.

In this server 10, the cooling unit 33 and the fixation unit 50 are provided so as to be integrated by means of the reinforcement member 38. As a result thereof, the respective ends of the supply connection pipe 36 and the discharge connection pipe 37 that are connected to the cooling unit 33, and the respective intermediate portions of the supply connection pipe 36 and the discharge connection pipe 37 that are fixed to the fixation portion 50 are firmly held. Therefore, it is possible to keep stress from being applied to the supply connection pipe 36 and the discharge connection pipe 37.

In this server 10, the fixation portion 50 is arranged towards the substrate 32 relative to the rear plate 24, so the fixation portion 50 does not protrude to the outside of the housing 20. As a result thereof, it is possible to keep the fixation portion 50 from interfering with other components in the periphery of the module 30.

Additionally, by fixing the fixation portion 50 to the reinforcement member 38 on the inside of the rear plate 24, the supply connection pipe 36 and the discharge connection pipe 37 can be firmly supported.

In this server 10, there are elastic sheets 55 sandwiched between the fixation portion 50, and the supply connection pipe 36 and the discharge connection pipe 37. As a result thereof, when a force is exerted on the supply connection pipe 36 and the discharge connection pipe 37, the elastic sheets 55 can elastically deform, thereby keeping excessive force from being applied between the fixation portion 50, and the supply connection pipe 36 and the discharge connection pipe 37. Therefore, the interior spaces in the supply connection pipe 36 and the discharge connection pipe 37 can be kept from being crushed, and decreases in cooling performance due to increased flow resistance on the coolant can be suppressed.

Additionally, the elastic sheets 55 protrude to the insides of the opening portions 25 in the rear plate 24, thereby keeping the supply connection pipe 36 and the discharge connection pipe 37 from scraping against the inner rim of the opening portions 25 in the rear plate 24.

In this server 10, the supply connection pipe 36 and the discharge connection pipe 37 extend in a direction D12 different from the insertion/withdrawal direction D11 of the connection terminal portion 35. The fixation portion 50 fixes the supply connection pipe 36 and the discharge connection pipe 37 on the short edge S12 of the substrate 32 from which the supply connection pipe 36 and the discharge connection pipe 37 extend. As a result thereof, in the module 30 comprising the supply connection pipe 36 and the discharge connection pipe 37 extending in the direction D12 different from the insertion/withdrawal direction D11 of the connection terminal portion 35, stress applied from the supply connection pipe 36 and the discharge connection pipe 37 to the cooling unit 33 can be reduced. As a result thereof, it is possible to keep too much force from being applied to the cooling unit 33, or to the connection portions for connecting the supply connection pipe 36 and the discharge connection pipe 37 to the cooling unit 33, thereby preventing leakage of the coolant and the like.

In this server 10, the supply connection pipe 36 and the discharge connection pipe 37 have flexibility. The supply connection pipe 36 and the discharge connection pipe 37 having flexibility are fixed by the fixation portion 50. Thus, the effect of reducing stress applied from the supply connection pipe 36 and the discharge connection pipe 37 to the cooling unit 33 becomes more pronounced. As a result thereof, it is possible to effectively keep too much force from being applied to the cooling unit 33, or to the connection portions for connecting the supply connection pipe 36 and the discharge connection pipe 37 to the cooling unit 33, thereby preventing leakage of the coolant and the like.

Additionally, in the above-described embodiment, it is described that the fixation portion 50 constrains the supply connection pipe 36 and the discharge connection pipe 37 in the pipe axial direction. However, it is not always essential for the supply connection pipe 36 and the discharge connection pipe 37 to be constrained in the pipe axial direction. In other words, it is sufficient for the fixation portion 50 to reduce the stress from the supply connection pipe 36 and the discharge connection pipe 37 to the cooling unit 33.

Additionally, it is described that the cooling unit 33 cools only the heat-generating component 34, but other electronic components provided on the substrate 32 may also be cooled. Additionally, the heat transfer between the heat-generating component and the cooling unit is not limited to being made through direct contact, and may be mediated by an electrically insulating thin-film (mica) or a fluid such as grease, or mediated by an intermediary member formed from a material having good thermal conductivity.

Aside from the above, it is possible to select whether or not to adopt features described in the above-mentioned embodiments, or to make appropriate changes to other features, as long as they do not depart from the spirit of the present invention.

Some or all of the above-mentioned embodiments may be described as in the following supplementary notes, but are not limited to the following.

(Supplementary Note 1)

A module comprising:

a cooling unit that cools a heat-generating component provided on a substrate;

a connection pipe that is connected to the cooling unit; and a fixation portion that is provided at a position at which stress from the connection pipe to the cooling unit is reduced, and that fixes the connection pipe.

(Supplementary Note 2)

The module according to Supplementary Note 1, wherein the fixation portion constrains movement of the connection pipe in a pipe axial direction.

(Supplementary Note 3)

The module according to Supplementary Note 1 or 2, wherein:

the connection pipe has one end connected to the cooling unit; and the fixation portion fixes the connection pipe at a position distanced from the one end.

(Supplementary Note 4)

The module according to any one of Supplementary Notes 1 to 3, wherein the connection pipe is curved between a first part connected to the cooling unit and a second part fixed to the fixation portion.

(Supplementary Note 5)

The module according to any one of Supplementary Notes 1 to 4, wherein, on the connection pipe, a first spacing between the substrate and the first part connected to the cooling unit is the same as a second spacing between the substrate and the second part fixed to the fixation portion.

(Supplementary Note 6)

The module according to any one of Supplementary Notes 1 to 5, further comprising:

a reinforcement member arranged parallel to the substrate;

wherein the cooling unit and the fixation unit are each fixed to the reinforcement member.

(Supplementary Note 7)

The module according to any one of Supplementary Notes 1 to 6, wherein:

the connection pipe extends from the substrate towards an outer periphery;

a plate is provided, the plate facing an edge of the substrate from which the connection pipe extends and having an opening portion through which the connection pipe is passed; and the fixation portion is arranged on the plate, on a side towards the substrate.

(Supplementary Note 8)

The module according to any one of Supplementary Notes 1 to 7, further comprising an elastic sheet sandwiched between the fixation portion and the connection pipe.

(Supplementary Note 9)

The module according to any one of Supplementary Notes 1 to 8, wherein:

the substrate has a connection terminal portion;

the connection pipe extends in a direction different from an insertion/withdrawal direction of the connection terminal portion; and the fixation portion fixes the connection pipe on an edge of the substrate from which the connection pipe extends.

(Supplementary Note 10)

The module according to any one of Supplementary Notes 1 to 9, wherein the connection pipe has flexibility.

(Supplementary Note 11)

A server comprising:

the module according to any one of Supplementary Notes 1 to 10; and a housing that contains the module.

INDUSTRIAL APPLICABILITY

According to the module and the server in the present invention, it is possible to reduce stress that is generated when a force is exerted on a connection pipe.

REFERENCE SIGNS LIST

1 Module
2 Substrate
3 Cooling unit
4 Heat-generating component
5 Connection pipe
6 Fixation portion
7 Server
8 Housing
10 Server
20 Housing
24 Rear plate (plate)
25 Opening portion
30 Module
32 Substrate
33 Cooling unit
34 Heat-generating component
36 Supply connection pipe (connection pipe)
37 Discharge connection pipe (connection pipe)
38 Reinforcement member
50 Fixation portion
55 Elastic sheet
D11 Insertion/withdrawal direction
D12 Different direction
S12 Short edge (pipe-extending edge)

The invention claimed is:

1. A module comprising:

a cooling unit that cools a heat-generating component directly provided on a surface of a substrate;

a reinforcement member that is directly provided on the surface of the substrate and that is parallel to the substrate;

a connection pipe that is connected to the cooling unit; and a fixation portion that is provided on the reinforcement member, that is provided at a position at which stress from the connection pipe to the cooling unit is reduced, and that fixes the connection pipe, wherein the connection pipe extends from the substrate towards an outer periphery, and a plate is provided, the plate facing an edge of the substrate from which the connection pipe extends and having an opening portion through which the connection pipe is passed.

2. The module according to claim 1, wherein the fixation portion constrains movement of the connection pipe in a pipe axial direction.

3. The module according to claim 1, wherein:

the connection pipe has one end connected to the cooling unit; and the fixation portion fixes the connection pipe at a position distanced from the one end.

4. The module according to claim 1, wherein the connection pipe is curved between a first part connected to the cooling unit and a second part fixed to the fixation portion.

5. The module according to claim 1,
wherein the connection pipe has a first part connected to the cooling unit and a second part fixed to the fixation portion, and
on the connection pipe, a first spacing between the substrate and the first part connected to the cooling unit is the same as a second spacing between the substrate and the second part fixed to the fixation portion.

6. The module according to claim 1,
wherein the cooling unit and the fixation portion are each fixed to the reinforcement member.

7. The module according to claim 1, further comprising an elastic sheet sandwiched between the fixation portion and the connection pipe.

8. The module according to claim 1, wherein:
the substrate has a connection terminal portion;
the connection pipe extends in a direction different from an insertion/withdrawal direction of the connection terminal portion; and
the fixation portion fixes the connection pipe on an edge of the substrate from which the connection pipe extends.

9. The module according to claim 1, wherein the connection pipe has flexibility.

10. The module according to claim 1, wherein the reinforcement member reinforces the substrate, and receives heat transferred from the heat-generating component and dissipates the heat.

11. The module according to claim 1, wherein the reinforcement member comprises an aluminum alloy.

12. A server comprising:
a module; and
a housing that contains the module, and
wherein the module comprises:
a cooling unit that cools a heat-generating component directly provided on a surface of a substrate;
a reinforcement member that is directly provided on the surface of the substrate and that is parallel to the substrate;
a connection pipe that is connected to the cooling unit; and
a fixation portion that is provided on the reinforcement member, that is provided at a position at which stress from the connection pipe to the cooling unit is reduced, and that fixes the connection pipe,
wherein the connection pipe extends from the substrate towards an outer periphery, and
a plate is provided, the plate facing an edge of the substrate from which the connection pipe extends and having an opening portion through which the connection pipe is passed.

* * * * *